United States Patent
Lautzenhiser

(10) Patent No.: US 10,616,013 B1
(45) Date of Patent: Apr. 7, 2020

(54) DC COUPLED DIGITAL DEMODULATOR WITH DRIFT ELIMINATOR

(71) Applicant: Emhiser Research Limited, Chemainus (CA)

(72) Inventor: Lloyd L. Lautzenhiser, Verdi, NV (US)

(73) Assignee: Emhiser Research Limited, Chemainus (CA)

( * ) Notice: Subject to any disclaimer, the term of this patent is extended or adjusted under 35 U.S.C. 154(b) by 0 days.

(21) Appl. No.: 16/233,543

(22) Filed: Dec. 27, 2018

(51) Int. Cl.
| | |
|---|---|
| H04L 25/06 | (2006.01) |
| H03K 9/06 | (2006.01) |
| H04L 27/14 | (2006.01) |
| H03K 5/007 | (2006.01) |
| H03K 5/08 | (2006.01) |
| H03D 3/00 | (2006.01) |

(52) U.S. Cl.
CPC ............. *H04L 25/063* (2013.01); *H03D 3/00* (2013.01); *H03K 5/007* (2013.01); *H03K 5/088* (2013.01); *H03K 9/06* (2013.01); *H04L 27/14* (2013.01); *H04L 27/142* (2013.01)

(58) Field of Classification Search
CPC ........ H03D 3/001; H03D 3/003; H03D 3/008; H03D 3/28; H03D 2200/011; H03D 2200/0043; H03D 2200/0047; H03D 2200/0098; H04L 27/14; H04L 27/142; H04L 25/06–25/069; H03K 5/003; H03K 5/007; H03K 5/088; H03K 9/06
See application file for complete search history.

(56) References Cited

U.S. PATENT DOCUMENTS

| | | | |
|---|---|---|---|
| 4,087,756 A | 5/1978 | Rogers, Jr. | |
| 4,553,102 A | 11/1985 | Yoshida | |
| 4,653,072 A | 3/1987 | Vercellotti et al. | |
| 5,089,822 A | 2/1992 | Abaunza et al. | |
| 5,295,162 A | 3/1994 | Zarembowitch | |
| 5,448,202 A | 9/1995 | Owen | |
| 5,587,681 A * | 12/1996 | Fobbester | H03K 5/003 327/180 |
| 5,608,762 A | 3/1997 | Maddy | |

(Continued)

OTHER PUBLICATIONS

"Low-drift digital SWFM demodulator", B. Wilson, A.J. Dodd and L. Sliwczynski, Electronics Letters, vol. 33 No. 24, Nov. 20, 1997 (2 pages).

*Primary Examiner* — Ryan Johnson
(74) *Attorney, Agent, or Firm* — Taylor IP, P.C.

(57) ABSTRACT

An electronic assembly including a plurality of electrically conductive elements separated by insulative material and a digital FM demodulator circuit coupled to some of the electrically conductive elements. The FM demodulator circuit having an FM detector circuit and a DC drift reducing circuit. The FM detector circuit has a detector input and a detector output that is the output of a comparator that is AC coupled to the rest of the FM detector circuit, the detector input receiving an input signal. The DC drift reducing circuit is electrically coupled to the detector output of the comparator, the DC drift reducing circuit detecting a DC drift of the detector output, the DC drift reducing circuit being additionally coupled to an input of the comparator, the DC drift reducing circuit substantially eliminating DC drift at the output of the FM demodulator circuit.

20 Claims, 2 Drawing Sheets

(56) References Cited

U.S. PATENT DOCUMENTS

| | | |
|---|---|---|
| 5,949,827 A | 9/1999 | Deluca et al. |
| 6,038,267 A | 3/2000 | Oura et al. |
| 6,173,018 B1 | 1/2001 | Kuroki |
| 6,356,749 B1 * | 3/2002 | Rollins .................... H04B 1/28 455/296 |
| 6,445,246 B1 * | 9/2002 | Yoshida ................. H03K 5/007 329/300 |
| 6,686,861 B1 * | 2/2004 | Kobayashi ............. H03K 5/003 327/307 |
| 7,050,666 B2 | 5/2006 | Welch et al. |
| 7,072,427 B2 | 7/2006 | Rawlins et al. |
| 7,106,388 B2 | 9/2006 | Vorenkamp et al. |
| 7,200,188 B2 | 4/2007 | Fague et al. |
| 8,085,067 B1 | 12/2011 | Stiff |
| 8,330,873 B2 | 12/2012 | Silver et al. |
| 9,203,363 B2 | 12/2015 | Motz et al. |

* cited by examiner

DC COUPLED DIGITAL DEMODULATOR WITH DRIFT ELIMINATOR

BACKGROUND OF THE INVENTION

1. Field of the Invention

The present invention relates to a conversion of an AC coupled digital demodulator to a DC coupled version with a drift eliminator.

2. Description of the Related Art

Looking first at FIG. 1, U4 (an ML13155 IC) is a Lansdale device configured for demodulation of an FM signal operating at a center frequency of 140 MHz. U5 and associated circuitry converts the differential output of this device to single ended as required by the output comparator (U6).

For the sake of this discussion let us assume a peak-to-peak voltage at U5 Pin 6 of two (2) volts. This output peak to peak value remains reasonably constant over temperature but unfortunately the average value drifts excessively. For example if the output measures 1.5V and 3.5V, for a digital 0 and 1 respectively, at ambient, then at temperature extremes this could drift to 0.0V and 2.0V. Assuming a 50% duty cycle, the threshold voltage at comparator U6 pin 4 would self-adjust to 1.0V and the circuit would operate satisfactorily. The problem arises when U5 Pin 6 stays high or low for a period that significantly exceeds the time constant of R44 and C45. In this situation C45 charges up (or down) until the two inputs to comparator U6 are at the same voltage which is of course an indeterminate state. So anytime the duty cycle is something other than 50%, even in the short term, Bit Error Rate suffers. For this reason this circuit is referred to as AC coupled.

What is needed is a circuit that would ensure that the average value of the peak to peak voltage at the input to the comparator would always remain at 2.5V independent of temperature and duty cycle.

SUMMARY OF THE INVENTION

The present invention provides a DC coupled digital demodulator circuit that substantially reduces or eliminates DC drift on the output.

The invention in one form is directed to an electronic assembly including a plurality of electrically conductive elements separated by insulative material and a digital FM demodulator circuit coupled to some of the electrically conductive elements. The FM demodulator circuit having an FM detector circuit and a DC drift reducing circuit. The FM detector circuit has a detector input and a detector output that is the output of a comparator that is AC coupled to the rest of the FM detector circuit, the detector input receiving an input signal. The DC drift reducing circuit is electrically coupled to the detector output of the comparator, the DC drift reducing circuit detecting a DC drift of the detector output, the DC drift reducing circuit being additionally coupled to an input of the comparator, the DC drift reducing circuit substantially eliminating DC drift at the output of the FM demodulator circuit.

The invention in another form is directed to an FM demodulator circuit having an FM detector circuit and a DC drift reducing circuit. The FM detector circuit has a detector input and a detector output that is the output of a comparator that is AC coupled to the rest of the FM detector circuit, the detector input receiving an input signal. The DC drift reducing circuit is electrically coupled to the detector output of the comparator, the DC drift reducing circuit detecting a DC drift of the detector output, the DC drift reducing circuit being additionally coupled to an input of the comparator, the DC drift reducing circuit substantially eliminating DC drift at the output of the FM demodulator circuit.

An advantage of the present invention is that it reduces the bit error rate of the prior art configurations.

Another advantage of the present invention is that it functions regardless of the duty cycle of the signal being processed.

BRIEF DESCRIPTION OF THE DRAWINGS

The above-mentioned and other features and advantages of this invention, and the manner of attaining them, will become more apparent and the invention will be better understood by reference to the following description of an embodiment of the invention taken in conjunction with the accompanying drawings, wherein.

Corresponding reference characters indicate corresponding parts throughout the several views. The exemplification set out herein illustrate one embodiment of the invention and such exemplification is not to be construed as limiting the scope of the invention in any manner.

DETAILED DESCRIPTION OF THE INVENTION

As mentioned above, FIG. 1 illustrates a circuit configuration of the prior art in the form of an FM demodulator.

Figure 1:
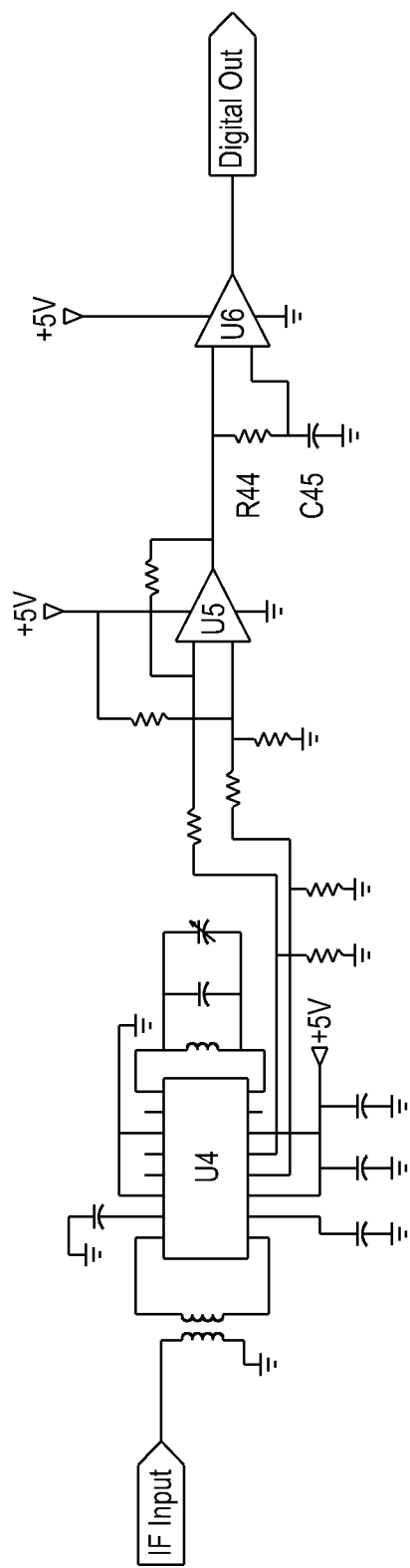
FIG. 1 is a schematical representation of a prior art AC coupled FM demodulator circuit.
Figure 2:
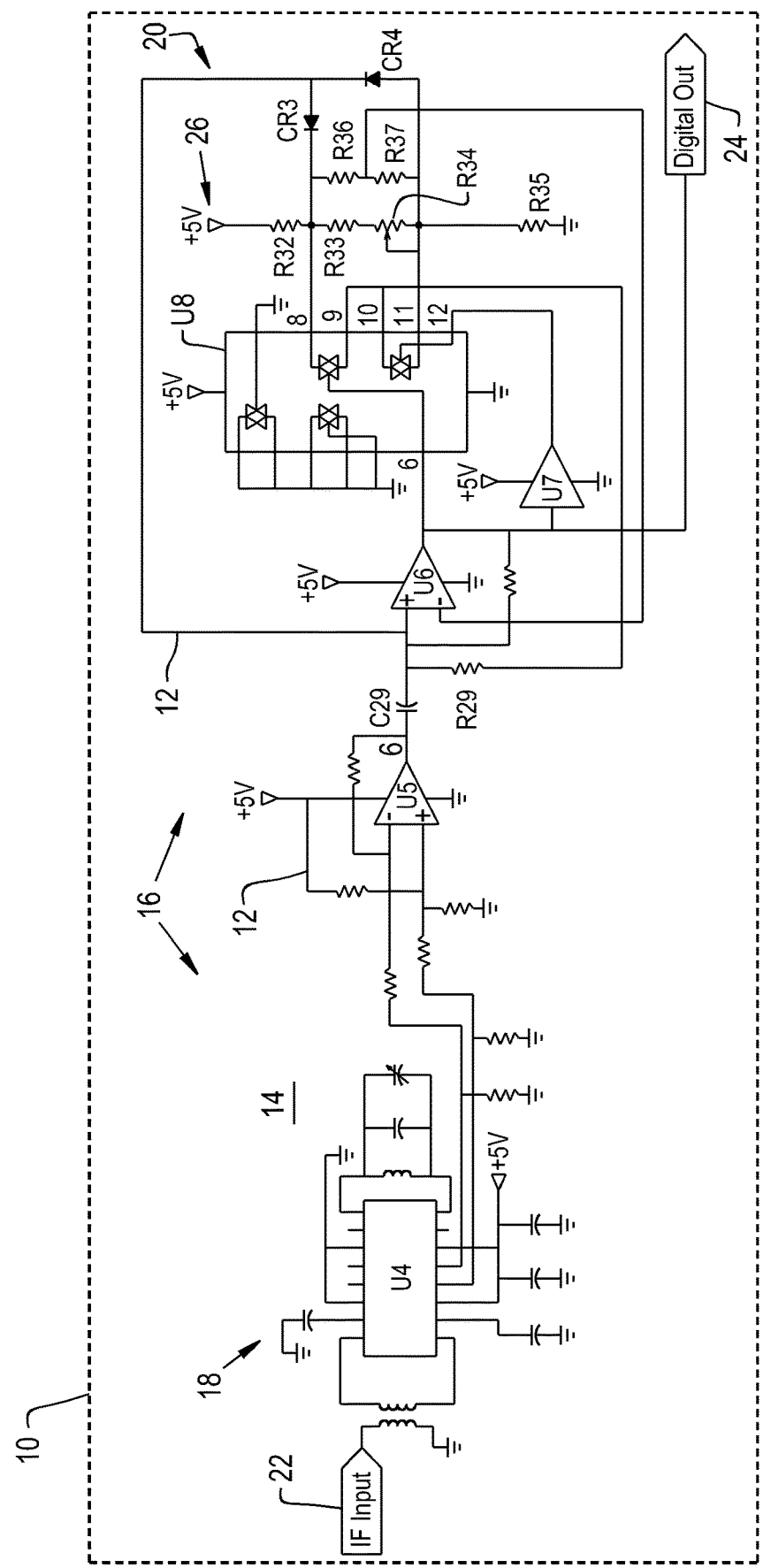
FIG. 2 is a schematical representation of an embodiment of a DC coupled FM demodulator with a DC drift eliminator circuit of the present invention.

Now, looking at FIG. 2, there is illustrated an electronic assembly 10. Note that similar numbering of circuit components from FIG. 1, are for the ease of understanding and does not indicate that they are all functionally equivalent. The electronic assembly 10 has electrically conductive pathways 12 coupled to insulative material 14 with a digital frequency modulated (FM) demodulator circuit 16 coupled to some of the electrically conductive elements 12. The FM demodulator circuit 16 includes an FM detector circuit 18 and a direct current (DC) drift eliminating circuit 20. DC drift eliminating circuit 20 is also referred to as DC drift reducing circuit 20 in that circuit 20 substantially reduces DC drift to the point of elimination of the DC drift of the output signal.

The FM demodulator circuit 16 has a detector input 22 and a detector output 24 that is the output of a comparator U6 that is alternating current (AC) coupled by way of capacitor C29 to the rest of the FM detector circuit U4, U5, the detector input 22 receiving an input signal. The DC drift reducing circuit 20 is electrically coupled to the detector output 24 of comparator U6, and is additionally coupled to an input of the comparator U6. The DC drift reducing circuit 20 detects a DC drift at the + input of U6, and the DC drift reducing circuit 20 substantially or completely eliminates this DC drift.

The DC drift reducing circuit 20 has a first mode of operation or a second mode of operation selected depending upon comparing a detected voltage to a threshold voltage. The DC drift reducing circuit 20 further includes a first electronically activated switch Pins 6, 8, 9 of U8 and a second electronically activated switch Pins 10-12 of U8, the first mode of operation being carried out if the first electronically activated switch Pins 6, 8, 9 of U8 is activated and the second mode of operation being carried out if the second electronically activated switch Pins 10-12 of U8 is activated.

DC drift reducing circuit 20 further includes an inverter circuit U7 coupled to at least one of the first electronically activated switch Pins 6, 8, 9 of U8 and the second electronically activated switch Pins 10-12 of U8, the inverter U7 ensuring that only the first electronically activated switch Pins 6, 8, 9 of U8 or the second electronically activated switch Pins 10-12 of U8 is engaged by the DC drift reducing circuit 20. DC drift reducing circuit 20 is additionally electrically coupled to a first input + of the comparator U6 and to a second input − of the comparator. The first input + of comparator U6 additionally being electrically connected to a capacitor C29 that is AC coupled to the rest of the FM detector circuit U5 and U4.

The first mode of operation includes activating (by Pin 6 of U8) a circuit path via Pins 8 and 9 of U8 to the first input + of the comparator U6 from a DC voltage source 26 through a first resistor network R32, R33, R34, R29. During the first mode of operation the second input − of the comparator U6 receives a voltage from the voltage source 26 through a second resistor network R36, R37. DC drift reducing circuit 20 additionally includes a diode CR3 that is electrically connected to the first resistor network R32, R33, R34, R29 and is electrically connected to the first input + of the comparator U6.

The second mode of operation includes activating (by Pin 12 of U8) a circuit path via Pins 10 and 11 of U8 to the first input + of comparator U6 from DC voltage source 26 through a third resistor network R33, R34, R35. During the second mode of operation the second input − of comparator U6 receives a voltage from the voltage source 26 through the second resistor network R36, R37.

DC drift reducing circuit 20 additionally includes diode CR3 and diode CR4, with an anode of diode CR3 being electrically connected to a cathode of diode CR4 forming a junction thereby. The junction also being electrically connected to the first input + of comparator U6. A cathode of diode CR 3 being electrically connected to the second resistor network R36, R37, and an anode of diode CR4 is electrically connected to the second resistor network R36, R37.

Regarding the operation of circuit 16, first off note that the output of U5 is intentionally AC coupled into comparator U6 by way of capacitor C29. The threshold for comparator U6 is set by the junction of R33 and R34 to 2.5V regardless of the setting of R34. Even though now AC coupled, the peak to peak value of the digital signal remains at 2V. Circuit U8 is a Texas Instruments 74HC4066 quad switch that presents a low impedance across Pins 8 and 9 or across 10 and 11 when their respective control pins (Pin 6 and Pin 12) are at a logic 1. Note that due to invertor U7, either Pins 8 and 9 are shorted or Pins 10 and 11, never both simultaneously.

Resistor R34 is adjusted so that the voltage from U8 Pin 8 to U8 Pin 11 is set at the peak to peak voltage at U5 Pin 6, in this example 2V, so that the junction of resistors R34 and R35 will be set at 1.5V and the junction of resistors R32 and R33 at 3.5V.

Let us assume that at low temperature the circuit "wakes up" with a digital "0" at 0.0V and a "1" at 2.0V at U5 Pin 6. The "0" would quickly be brought to approximately 1.0 V due to the action of diode CR4. The input swing at the input + of comparator U6 would now be 1.0V and 3.0V which now crosses the threshold of 2.5V. At the 3.0V input level, the output of comparator U6 driving quad switch U8 will cause U8 Pin 8 to close to U8 Pin 9. This then places the voltage at the junction of resistors R32 and R33 (3.5V) at the bottom of resistor R29. With a time constant of 10 milliseconds, this 3.5V will appear then at the comparator side of capacitor C29 whenever the threshold of comparator U6 is exceeded on the positive side of 2.5V.

Note that had the circuit woken up with an output of U5 attempting to output 3.0V for a "0" and 5.0V for a "1", the opposite mode of operation would have occurred with diode CR3 clamping the upper level to approximately 4.0V. The "0" would now be at 2.0V and comparator U6 would again be in the active region.

With U8 clamping the comparator side of capacitor C29 at either 1.5V for a "0" or 3.5V for a "1", capacitor C29 now acts as a DC block only as there would be no charge flowing either way through this component at any time other than during a short period of initialization.

In this manner the output of comparator U6 will remain at a logic "1" for as long as the output of U5 is at its upper level and at a logic "0" for as long as this point is at its lower level. Note the circuit is now truly DC coupled with the output staying at a logic "1" or "0" for days if necessary.

While this invention has been described with respect to at least one embodiment, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. An electronic assembly comprising:
   a plurality of electrically conductive elements separated by insulative material; and
   a digital frequency modulated (FM) demodulator circuit coupled to some of the electrically conductive elements, the FM demodulator circuit including:
   an FM detector circuit having a detector input and a detector output that is the output of a comparator that is alternating current (AC) coupled to the rest of the FM detector circuit, the detector input receiving an input signal; and
   a direct current (DC) drift reducing circuit electrically coupled to the detector output of the comparator, the DC drift reducing circuit detecting a DC drift of the detector output, the DC drift reducing circuit being additionally coupled to an input of the comparator, the DC drift reducing circuit substantially eliminating DC drift at the output of the FM demodulator circuit.

2. The electronic assembly of claim 1, wherein the DC drift reducing circuit has a first mode of operation or a second mode of operation selected depending upon comparing a detected voltage to a threshold voltage.

3. The electronic assembly of claim 2, wherein the DC drift reducing circuit further includes a first electronically activated switch and a second electronically activated switch, the first mode of operation being carried out if the first electronically activated switch is activated and the second mode of operation being carried out if the second electronically activated switch is activated.

4. The electronic assembly of claim 3, wherein the DC drift reducing circuit further includes an inverter circuit coupled to at least one of the first electronically activated switch and the second electronically activated switch, the inverter ensuring that only the first electronically activated switch or the second electronically activated switch is engaged by the DC drift reducing circuit.

5. The electronic assembly of claim 2, wherein the DC drift reducing circuit additionally being electrically coupled to a first input of the comparator and to a second input of the comparator, the first input additionally being electrically connected to a capacitor that is AC coupled to the rest of the FM detector circuit.

6. The electronic assembly of claim 5, wherein the first mode of operation includes activating a circuit path to the first input of the comparator from a DC voltage source through a first resistor network.

7. The electronic assembly of claim 6, wherein during the first mode of operation the second input of the comparator receives a voltage from the voltage source through a second resistor network.

8. The electronic assembly of claim 7, wherein the DC drift reducing circuit additionally includes a diode that is electrically connected to the first resistor network and is electrically connected to the first input of the comparator.

9. The electronic assembly of claim 7, wherein the second mode of operation includes activating a circuit path to the first input of the comparator from a DC voltage source through a third resistor network.

10. The electronic assembly of claim 9, wherein during the second mode of operation the second input of the comparator receives a voltage from the voltage source through the second resistor network.

11. The electronic assembly of claim 10, wherein the DC drift reducing circuit additionally includes a first diode and a second diode, an anode of the first diode being electrically connected to a cathode of the second diode forming a junction thereby, the junction also being electrically connected to the first input of the comparator, a cathode of the first diode being electrically connected to the second resistor network, an anode of the second diode being electrically connected to the second resistor network.

12. A digital frequency modulated (FM) demodulator circuit, comprising:
    an FM detector circuit having a detector input and a detector output that is the output of a comparator that is alternating current (AC) coupled to the rest of the FM detector circuit, the detector input receiving an input signal; and
    a direct current (DC) drift reducing circuit electrically coupled to the detector output of the comparator, the DC drift reducing circuit detecting a DC drift of the detector output, the DC drift reducing circuit being additionally coupled to an input of the comparator, the DC drift reducing circuit substantially eliminating DC drift at the output of the FM demodulator circuit.

13. The FM demodulator circuit of claim 12, wherein the DC drift reducing circuit has a first mode of operation or a second mode of operation selected depending upon comparing a detected voltage to a threshold voltage.

14. The FM demodulator circuit of claim 13, wherein the DC drift reducing circuit further includes a first electronically activated switch and a second electronically activated switch, the first mode of operation being carried out if the first electronically activated switch is activated and the second mode of operation being carried out if the second electronically activated switch is activated.

15. The FM demodulator circuit of claim 14, wherein the DC drift reducing circuit further includes an inverter circuit coupled to at least one of the first electronically activated switch and the second electronically activated switch, the inverter ensuring that only the first electronically activated switch or the second electronically activated switch is engaged by the DC drift reducing circuit.

16. The FM demodulator circuit of claim 13, wherein the DC drift reducing circuit additionally being electrically coupled to a first input of the comparator and to a second input of the comparator, the first input additionally being electrically connected to a capacitor that is AC coupled to the rest of the FM detector circuit.

17. The FM demodulator circuit of claim 16, wherein the first mode of operation includes activating a circuit path to the first input of the comparator from a DC voltage source through a first resistor network.

18. The FM demodulator circuit of claim 17, wherein during the first mode of operation the second input of the comparator receives a voltage from the voltage source through a second resistor network.

19. The FM demodulator circuit of claim 18, wherein the DC drift reducing circuit additionally includes a diode that is electrically connected to the first resistor network and is electrically connected to the first input of the comparator.

20. The FM demodulator circuit of claim 18, wherein the DC drift reducing circuit additionally includes a first diode and a second diode, when the DC drift reducing circuit is in the second mode of operation a circuit path is activated to the first input of the comparator from a DC voltage source through a third resistor network, the second input of the comparator receives a voltage from the voltage source through the second resistor network, and an anode of the first diode is electrically connected to a cathode of the second diode forming a junction thereby, the junction being electrically connected to the first input of the comparator, a cathode of the first diode being electrically connected to the second resistor network, an anode of the second diode being electrically connected to the second resistor network.

\* \* \* \* \*